US010553780B2

(12) United States Patent
Schreiter et al.

(10) Patent No.: US 10,553,780 B2
(45) Date of Patent: Feb. 4, 2020

(54) METHOD FOR PRODUCING A POLYCRYSTALLINE CERAMIC FILM

(71) Applicant: SIEMENS AKTIENGESELLSCHAFT, München (DE)

(72) Inventors: Matthias Schreiter, München (DE); Wolfram Wersing, Bergen (DE)

(73) Assignee: Siemens Aktiengesellschaft, München (DE)

( * ) Notice: Subject to any disclaimer, the term of this patent is extended or adjusted under 35 U.S.C. 154(b) by 0 days.

(21) Appl. No.: 14/411,861

(22) PCT Filed: Jun. 18, 2013

(86) PCT No.: PCT/EP2013/062606
§ 371 (c)(1),
(2) Date: Dec. 29, 2014

(87) PCT Pub. No.: WO2014/001146
PCT Pub. Date: Jan. 3, 2014

(65) Prior Publication Data
US 2015/0136586 A1 May 21, 2015

(30) Foreign Application Priority Data

Jun. 29, 2012 (DE) .......................... 10 2012 211 314

(51) Int. Cl.
| C23C 14/34 | (2006.01) |
| H01L 41/316 | (2013.01) |
| C23C 14/08 | (2006.01) |
| C23C 14/54 | (2006.01) |
| H01J 37/34 | (2006.01) |
| C23C 14/00 | (2006.01) |
| C23C 14/06 | (2006.01) |
| H03H 9/17 | (2006.01) |

(52) U.S. Cl.
CPC ........ *H01L 41/316* (2013.01); *C23C 14/0036* (2013.01); *C23C 14/0641* (2013.01); *C23C 14/086* (2013.01); *C23C 14/542* (2013.01); *C23C 14/548* (2013.01); *H01J 37/3447* (2013.01); *H03H 9/171* (2013.01)

(58) Field of Classification Search
CPC . C23C 14/1641; C23C 14/086; C23C 14/548; C23C 14/542; H01J 37/3447
See application file for complete search history.

(56) References Cited

U.S. PATENT DOCUMENTS

| 5,171,412 A * | 12/1992 | Talieh ................... C23C 14/046 204/192.15 |
| 5,885,425 A * | 3/1999 | Hsieh ................... C23C 14/046 204/192.12 |
| 6,132,892 A * | 10/2000 | Yoshikawa ............ B82Y 10/00 204/192.2 |
| 6,362,097 B1 * | 3/2002 | Demaray ................ C23C 14/34 257/E21.091 |
| 2008/0197750 A1 | 8/2008 | Katardjiev et al. |
| 2011/0011632 A1 * | 1/2011 | Nakao ................... C23C 14/083 174/257 |
| 2011/0108105 A1 | 5/2011 | Dimer et al. |

FOREIGN PATENT DOCUMENTS

| DE | 102005014160A1 A1 | 10/2006 |
| WO | WO2004067797 A1 | 8/2004 |
| WO | WO2006101450A1 A1 | 9/2006 |
| WO | WO2006103134 A1 | 10/2006 |
| WO | WO2007085549A2 A2 | 8/2007 |
| WO | WO2009137556 A2 | 11/2009 |

OTHER PUBLICATIONS

Chinese Office Action for Chinese Patent Application No. 201380034791.3, dated Sep. 29, 2015 with English Translation.
Chen et al., "Oblique-angle sputtered AlN nanocolumnar layer as a buffer layer in GaN-based LED," Journal of Luminescence, Elsevier; Bd. 131, Nr. 6, pp. 1234-1238, ISSN: 0022-2313, DOI: 10.1016/j-jlumin.2011.02.016, XP055073034, NL, Mar. 4, 2011.
Foster, N.F. et al., Cadmium Sulphide and Zinc Oxide Thin-Film-Transducers, IEEE Transactions on sonics and ultrasonics, vol. SU-15, No. 1, Jan. 1968.
German Office Action for related German Application No. 10 2012 211 314.2, dated Feb. 20, 2013, with English Translation.
(Continued)

*Primary Examiner* — Jason Berman
(74) *Attorney, Agent, or Firm* — Lempia Summerfield Katz LLC

(57) ABSTRACT

The invention relates to a method for producing a polycrystalline ceramic film on a surface (12) of a substrate (10), in which a particle stream is directed onto the surface (12) and the ceramic film is formed by deposition of the particles onto the surface (12), wherein the particle stream is directed by means of a diaphragm onto the surface (12) along a preferred direction until a first specified layer thickness is reached, the preferred direction and a surface normal of the surface (12) enclosing a specified angle of incidence. According to the invention, the diaphragm is removed from the particle stream after the specified layer thickness has been reached, and additional particles are directed onto the surface (12) until a specified second layer thickness has been reached.

11 Claims, 1 Drawing Sheet

(56) References Cited

OTHER PUBLICATIONS

Lee et al., "Effect of oblique sputtering on microstructural modification of ZnO thin films," Journal of vacuum science and technology, Bd. 15, Nr. 3, pp. 1194-1199, ISSN: 0734-2101, DOI: 10.1116/1.580592, XP055073026, 1997, US, May 1, 1997.

Link et al., "C-axis inclined ZnO films for shear-wave transducers deposited by reactive sputtering using an additional blind," Journal of vacuum science and technology, Bd 24, Nr. 2, pp. 218-222, ISSN: 0734-2101, DOI:10.1116/1.2165658, XP012090907, 2006, US, Feb. 8, 2006.

PCT International Search Report and Written Opinion of the International Searching Authority dated Aug. 2, 2013 for corresponding PCT/EP2013/062606.

\* cited by examiner

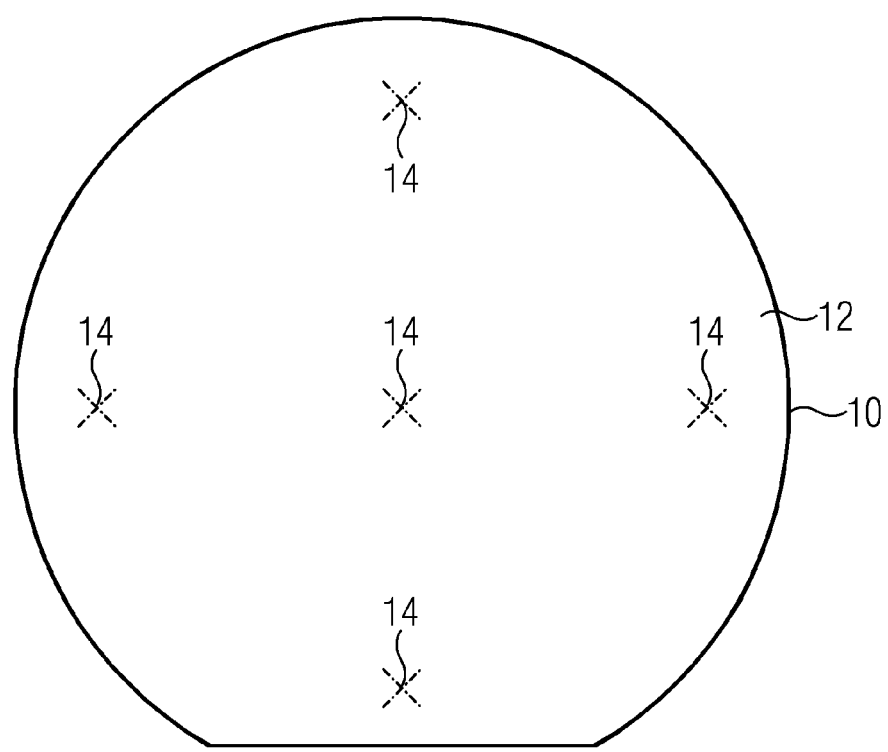

METHOD FOR PRODUCING A POLYCRYSTALLINE CERAMIC FILM

This application is the National Stage of International Application No. PCT/EP2013/062606, filed Jun. 18, 2013, which claims the benefit of DE 10 2012 211 314.2, filed Jun. 29, 2012. The entire contents of these documents are hereby incorporated herein by reference.

BACKGROUND

The present embodiments relate to producing a polycrystalline ceramic film.

Thin-film bulk acoustic resonators (FBAR), which experience changes in resonant frequency on specific binding of substances to be detected on a surface, are increasingly finding application in the area of biosensors. These are piezoelectric crystal layers that are applied to appropriate substrates (e.g., Si wafers).

Because the detection of biomolecules takes place in fluids, high resonance quality and sensitivity are to be provided. For this, the resonator is to be excited in the acoustic shear mode.

In order to make such excitation possible, the polar crystal axis is to be inclined to the exciting field. In a classical resonator structure, in which the piezoelectric is enclosed between two electrode layers, the polar axis is to therefore have a component in the electrode plane.

When ZnO is used as the dielectric, at tilts of approximately 40° and approximately 90°, pure shear waves are excited (Foster, N. F. et al., Cadmium Sulfide and Zinc Oxide Thin-Film Transducers, IEEE Transactions on sonics and ultrasonics, Vol. SU-15, No. 1, January 1968). However, even relatively small tilts of, for example, 15° are sufficient to obtain functional shear-mode resonators In order to achieve such a tilt of the polar axis, DE 10 2005 014 160 A1 describes a method in which the piezoelectric is deposited by reactive sputtering. Using a diaphragm, a preferred direction of incidence of the particles is established, which makes the desired angle with a normal to the substrate surface on which the ceramic is being deposited.

A disadvantage of the known method is that most of the stream of material is deposited on the diaphragm and not on the substrate. This leads to low deposition rates, and the equipment is to be cleaned and reset after just a few deposition operations. This is very time-consuming and results in high costs. Use of the diaphragm system also results in low reproducibility of the deposition result, especially with respect to layer homogeneity.

SUMMARY AND DESCRIPTION

The scope of the present invention is defined solely by the appended claims and is not affected to any degree by the statements within this summary.

The present embodiments may obviate one or more of the drawbacks or limitations in the related art. For example, a method that allows rapid, economical and reproducible production of ceramic films with an inclined polar axis is provided.

In a method for producing a polycrystalline ceramic film on a surface of a substrate, a stream of particles is directed onto the surface, and the ceramic film is formed by deposition of the particles on the surface. Until a first specified layer thickness is reached, the particle stream is directed onto the surface in a preferred direction by a diaphragm, making a specified angle of incidence with a normal to the surface.

According to one or more of the present embodiments, after reaching the specified layer thickness, the diaphragm is removed from the particle stream, and further particles are directed onto the surface until a second specified layer thickness is reached.

In other words, the diaphragm is only used for producing a seed layer of the ceramic material (e.g., the layer with the first specified layer thickness), which has the desired axis orientation. After formation of this seed layer, deposition may be continued without the aid of the diaphragm, as the crystals of the seed layer continue to grow in the already specified preferred orientation even with undirected application of material.

This makes it possible, after production of the seed layer, to achieve far higher deposition rates. By no longer using diaphragms after production of the seed layer, in addition, far more of the ceramic material is deposited on the substrate. Fouling of the equipment with material caught on the diaphragms is reduced. This increases equipment operating time and lowers servicing and operating costs.

Using the method according to one or more of the present embodiments, layers that are far more homogeneous may be produced more productively. For example, the uniformity of layer thickness is improved, so that the finished resonators have a better-defined resonant frequency and therefore also have increased sensitivity when used as biosensors.

The particles directed onto the surface may be particles of the desired ceramic itself, or metal particles may be deposited, for example, by reactive sputtering, which only form the desired ceramic with a reactive gas once on the surface.

In one embodiment, the specified angle of incidence is, for example, selected from the range from 0 to 90° (e.g., the range from 10 to 30°). This provides that sufficient shear excitation may take place.

The first specified layer thickness (e.g., the thickness of the seed layer) may be 50 to 150 nm (e.g., 100 nm). This will provide that even in subsequent undirected application, reproducible growth of the layer will take place in the preferred orientation predefined by the seed layer.

The total layer thickness (e.g., the second specified layer thickness) may be 450 to 600 nm (e.g., 540 nm). In this range, resonators may be created with the desired resonant frequency in the range from 100 MHz to 10 GHz.

The particles used may be particles of ZnO and/or AlN or the corresponding metals. These are inexpensive materials that have the desired piezoelectric properties and may be applied by common methods of application (e.g., by sputtering or reactive sputtering).

BRIEF DESCRIPTION OF THE DRAWINGS

FIG. 1 shows a substrate wafer with a plurality of measuring points for quality control of a layer applied by one embodiment of a method.

DETAILED DESCRIPTION

In order to produce a thin-film bulk acoustic resonator (FBAR), a layer of a piezoelectric ceramic (e.g., ZnO) enclosed between planar electrodes is produced on a substrate 10 (e.g., a silicon wafer). The layer is applied by deposition processes that are known (e.g., sputtering).

In order to achieve the desired resonator properties, and to make the excitation of shear modes possible, the polar axis of the piezoelectric material is to make an angle with the normal to the substrate surface. For this, a seed layer of about 100 nm thickness is produced. During deposition of this seed layer, a diaphragm system is installed between a source for the particles to be deposited and the substrate surface 12, providing shadowing of certain angles of incidence, so that the particles are deposited on the substrate surface 12 in a preferred orientation with the polar axis tilted in the desired way.

As soon as the desired seed layer thickness is reached, the diaphragm system may be removed, and deposition may continue undirected. Owing to the axis orientation already produced in the seed layer, further growth of the layer is also directed, so that overall the desired tilt of the polar axis is achieved. This operation is continued until a total layer thickness of about 540 nm is reached.

During production of the seed layer, deposition rates of about 4 nm/min may be achieved, and after removal of the diaphragm system, these may be increased to up to 40 nm/min. In this way, the process is accelerated considerably compared to processes known from the prior art, in which a diaphragm system is used throughout the deposition operation.

To verify the quality of the layer produced, at several measuring points 14 of a 6″ wafer shown schematically in FIG. 1, samples of the layer are analyzed and compared with samples of a wafer fabricated by methods known from the prior art.

As shown in the table, the layers produced with the embodiment of the method are far more homogeneous. The dispersion of the layer thickness, measured by the standard deviation normalized to the layer thickness, improves from 10.3% to 3%. The process time may be reduced from 132 min to 34 min. There is no notable impairment of the shear coupling coefficient.

The much shorter residence time of the diaphragms in the particle stream leads to less fouling of the diaphragms and therefore to lower costs for cleaning and adjustment.

TABLE

Comparison of process and layer properties for layers produced according to the prior art and according to an embodiment

| | Embodiment | Prior art |
|---|---|---|
| Average layer thickness [nm] | 550 | 530 |
| σ (layer thickness)/layer thickness [%] | 3.0 | 10.3 |
| Shear coupling coefficient [%] | 11 | 12 |
| Process time [min] | 34 | 132 |
| Proportionate diaphragm residence time [%] | 17 | 100 |

Thus, a method that allows rapid, economical and safe production of piezoelectric ceramic layers with a specified tilt of the axis is provided.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method for producing a polycrystalline ceramic film on a surface of a substrate, the method comprising:
   directing a particle stream onto the surface, the polycrystalline ceramic film being formed by deposition of particles on the surface,
   wherein the directing comprises:
      forming a first layer, the forming of the first layer comprising directing, until a first specified layer thickness is reached, the particle stream by a diaphragm in a direction onto the surface, making a specified angle of incidence with a normal to the surface, the specified angle of incidence with the normal to the surface being a non-zero angle with a maximum of 90°; and
      after attainment of the first specified layer thickness with a desired crystalline axis orientation, directing further particles of the same particle stream of particles onto the surface with the diaphragm removed from the particle stream until a second specified layer thickness with the desired crystalline axis orientation of the first layer is reached, and
   wherein directing the further particles of the same particle stream of particles onto the surface comprises growing crystals from the first layer with the desired crystalline axis orientation of the first layer.

2. The method of claim 1, wherein the first specified layer thickness is 50 to 150 nm.

3. The method of claim 1, wherein the second specified layer thickness is 450 to 600 nm.

4. The method of claim 1, wherein particles of ZnO, particles of AlN, or a combination thereof is used as particles of the particle stream.

5. The method of claim 1, wherein the particle stream is provided by sputtering.

6. The method of claim 1, wherein the specified angle of incidence is selected from the range from 10 to 30°.

7. The method of claim 3, wherein the first specified layer thickness is 100 nm.

8. The method of claim 3, wherein the second specified layer thickness is 540 nm.

9. The method of claim 1, wherein the substrate is made of silicon.

10. A method for producing a thin-film bulk acoustic resonator, the method comprising:
   directing a particle stream onto a surface of a substrate, a polycrystalline ceramic film being formed by deposition of particles on the surface,
   wherein the directing comprises:
      forming a first layer, the forming of the first layer comprising directing, by a diaphragm, the particle stream in a direction onto the surface until a first specified layer thickness is reached, the direction on to the surface making a specified angle of incidence with a normal to the surface, the specified angle of incidence with the normal to the surface being a non-zero angle with a maximum of 90°; and
      after attainment of the first specified layer thickness with a desired crystalline axis orientation, directing further particles of the same particle stream of particles onto the surface with the diaphragm removed from the particle stream until a second specified layer thickness with the desired crystalline axis orientation of the first layer is reached, and wherein directing the further particles of the same particle stream of particles onto the surface comprises growing crystals from the first layer with the desired crystalline axis orientation of the first layer.

11. The method of claim 10, wherein the substrate is made of silicon.

* * * * *